United States Patent
Narui

(10) Patent No.: US 10,943,622 B2
(45) Date of Patent: *Mar. 9, 2021

(54) HIGH BANDWIDTH MEMORY HAVING PLURAL CHANNELS

(71) Applicant: MICRON TECHNOLOGY, INC., Boise, ID (US)

(72) Inventor: Seiji Narui, Sagamihara (JP)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 17/020,712

(22) Filed: Sep. 14, 2020

(65) Prior Publication Data

US 2020/0411062 A1 Dec. 31, 2020

Related U.S. Application Data

(63) Continuation of application No. 16/267,115, filed on Feb. 4, 2019, now Pat. No. 10,777,232.

(51) Int. Cl.
*G11C 5/06* (2006.01)
*G11C 7/10* (2006.01)
*H01L 27/108* (2006.01)
*H01L 25/065* (2006.01)

(52) U.S. Cl.
CPC .............. *G11C 5/06* (2013.01); *G11C 7/1057* (2013.01); *G11C 7/1069* (2013.01); *H01L 25/0657* (2013.01); *H01L 27/108* (2013.01)

(58) Field of Classification Search
CPC ....... G11C 5/06; G11C 7/1057; G11C 7/1069; H01L 25/0657; H01L 27/108
See application file for complete search history.

(56) References Cited

U.S. PATENT DOCUMENTS

| 8,964,440 B2* | 2/2015 | Kim .................... H01L 25/0657 365/51 |
| 9,899,352 B2 | 2/2018 | Kim |
| 9,984,032 B2* | 5/2018 | Kwon ................. G06F 13/4068 |
| 10,777,232 B2* | 9/2020 | Narui .................. H01L 25/0657 |
| 2012/0134193 A1 | 5/2012 | Ide |
| 2012/0294059 A1 | 11/2012 | Oh et al. |

(Continued)

OTHER PUBLICATIONS

ISR/WO dated May 29, 2020 for PCT Application No. PCT/US2020/016383.

*Primary Examiner* — Pho M Luu
(74) *Attorney, Agent, or Firm* — Dorsey & Whitney LLP

(57) ABSTRACT

An example apparatus includes: a control chip; a plurality of memory chips stacked on the control chip, the plurality of memory chips including first and second memory chips; and a plurality of via conductors connected between the plurality of memory chips and the control chip. Each of the first and second memory chips is divided into a plurality of channels including a first channel. The plurality of via conductors include a first via conductor electrically connected between the first channel in the first memory chip and the control chip, and a second via conductor electrically connected between the first channel in the second memory chip and the control chip. The first and second memory chips substantially simultaneously output read data read from the first channel to the first and second via conductors, respectively.

20 Claims, 13 Drawing Sheets

(56) References Cited

U.S. PATENT DOCUMENTS

| | | |
|---|---|---|
| 2013/0049223 A1 | 2/2013 | Nomoto et al. |
| 2014/0048947 A1* | 2/2014 | Lee .................... H01L 23/5384 |
| | | 257/774 |
| 2017/0025421 A1 | 1/2017 | Sakakibara et al. |
| 2018/0357156 A1 | 12/2018 | Narui et al. |
| 2020/0251148 A1 | 8/2020 | Narui |

* cited by examiner

|   | A | B | C | D | E | F | G | H |
|---|---|---|---|---|---|---|---|---|
| 1 |   |   |   |   |   |   |   |   |
| 2 | DM0R | DM0F | DM1R | DM1F | DM2R | DM2F | DM3R | DM3F |
| 3 | DQ0R | DQ0F | DQ8R | DQ8F | DQ16R | DQ16F | DQ24R | DQ24F |
| 4 | DQ1R | DQ1F | DQ9R | DQ9F | DQ17R | DQ17F | DQ25R | DQ25F |
| 5 | DQ2R | DQ2F | DQ10R | DQ10F | DQ18R | DQ18F | DQ26R | DQ26F |
| 6 | DQ3R | DQ3F | DQ11R | DQ11F | DQ19R | DQ19F | DQ27R | DQ27F |
| 7 | Spare1 | CCMD0 | CCMD1 | WCLK | RCLK0 | RCLK1 | RCLKR | Spare0 |
| 8 | DQ4R | DQ4F | DQ12R | DQ12F | DQ20R | DQ20F | DQ28R | DQ28F |
| 9 | DQ5R | DQ5F | DQ13R | DQ13F | DQ21R | DQ21F | DQ29R | DQ29F |
| 10 | DQ6R | DQ6F | DQ14R | DQ14F | DQ22R | DQ22F | DQ30R | DQ30F |
| 11 | DQ7R | DQ7F | DQ15R | DQ15F | DQ23R | DQ23F | DQ31R | DQ31F |
| 12 |   |   |   |   |   |   |   |   |

| | A | B | C | D | E | F | G | H |
|---|---|---|---|---|---|---|---|---|
| 1 | | | | | | | | |
| 2 | DM0R | DM0F | DM1R | DM1F | DM2R | DM2F | DM3R | DM3F |
| 3 | DQ0R | DQ0F | DQ8R | DQ8F | DQ16R | DQ16F | DQ24R | DQ24F |
| 4 | DQ1R | DQ1F | DQ9R | DQ9F | DQ17R | DQ17F | DQ25R | DQ25F |
| 5 | DQ2R | DQ2F | DQ10R | DQ10F | DQ18R | DQ18F | DQ26R | DQ26F |
| 6 | DQ3R | DQ3F | DQ11R | DQ11F | DQ19R | DQ19F | DQ27R | DQ27F |
| 7 | Spare1 | CCMD0 | CCMD1 | WCLK | RCLK0 | RCLK1 | RCLKR | Spare0 |
| 8 | DQ4R | DQ4F | DQ12R | DQ12F | DQ20R | DQ20F | DQ28R | DQ28F |
| 9 | DQ5R | DQ5F | DQ13R | DQ13F | DQ21R | DQ21F | DQ29R | DQ29F |
| 10 | DQ6R | DQ6F | DQ14R | DQ14F | DQ22R | DQ22F | DQ30R | DQ30F |
| 11 | DQ7R | DQ7F | DQ15R | DQ15F | DQ23R | DQ23F | DQ31R | DQ31F |
| 12 | | | | | | | | |

SID0  SID1  SID0  SID1  SID0  SID1  SID0  SID1

35

| | A | B | C | D | E | F | G | H |
|---|---|---|---|---|---|---|---|---|
| 1 | | | | | | | | |
| 2 | DM0R | DM0F | DM1R | DM1F | DM2R | DM2F | DM3R | DM3F |
| 3 | DQ0R | DQ0F | DQ8R | DQ8F | DQ16R | DQ16F | DQ24R | DQ24F |
| 4 | DQ1R | DQ1F | DQ9R | DQ9F | DQ17R | DQ17F | DQ25R | DQ25F |
| 5 | DQ2R | DQ2F | DQ10R | DQ10F | DQ18R | DQ18F | DQ26R | DQ26F |
| 6 | DQ3R | DQ3F | DQ11R | DQ11F | DQ19R | DQ19F | DQ27R | DQ27F |
| 7 | Spare1 | CCMD0 | CCMD1 | WCLK | RCLK0 | RCLK1 | RCLKR | Spare0 |
| 8 | DQ4R | DQ4F | DQ12R | DQ12F | DQ20R | DQ20F | DQ28R | DQ28F |
| 9 | DQ5R | DQ5F | DQ13R | DQ13F | DQ21R | DQ21F | DQ29R | DQ29F |
| 10 | DQ6R | DQ6F | DQ14R | DQ14F | DQ22R | DQ22F | DQ30R | DQ30F |
| 11 | DQ7R | DQ7F | DQ15R | DQ15F | DQ23R | DQ23F | DQ31R | DQ31F |
| 12 | | | | | | | | |

SID1  SID0  SID1  SID0  SID1  SID0  SID1  SID0

FIG. 9B

HIGH BANDWIDTH MEMORY HAVING PLURAL CHANNELS

CROSS-REFERENCE TO RELATED APPLICATION

This application is a continuation of U.S. patent application Ser. No. 16/267,115, filed Feb. 4, 2019, issued as U.S. Pat. No. 10,777,232 on Sep. 15, 2020. This application and patent are incorporated by reference herein in their entirety and for all purposes.

BACKGROUND

A memory device called HBM (High Bandwidth Memory) has a structure in which memory chips each having a plurality of channels are stacked. The channels can operate asynchronously and non-exclusively from each other. Because distinct data paths are assigned to the channels, respectively, the HBM can input or output a large amount of data at a high speed.

When an access is requested from a controller to a certain channel in a general HBM, a memory cell array included in any of the stacked memory chips is selected. Accordingly, when accesses are concentrated in the same channel, current consumption concentrates in the same region in the same memory chip, which may result in change of the power potential.

BRIEF DESCRIPTION OF THE DRAWINGS

FIG. 5 is a diagram showing a layout of via conductors arranged in a via formation region.

FIG. 6 is a table showing a layout of via conductors arranged in one area of the via formation region.

FIG. 8 is a diagram showing another layout of via conductors arranged in a via formation region.

FIGS. 9A and 9B are tables showing a layout of via conductors arranged in predetermined areas, respectively.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structural, logical and electrical changes may be made without departing from the scope of the present invention. The various embodiments disclosed herein are not necessarily mutually exclusive, as some disclosed embodiments can be combined with one or more other disclosed embodiments to form new embodiments.

Figure 1:
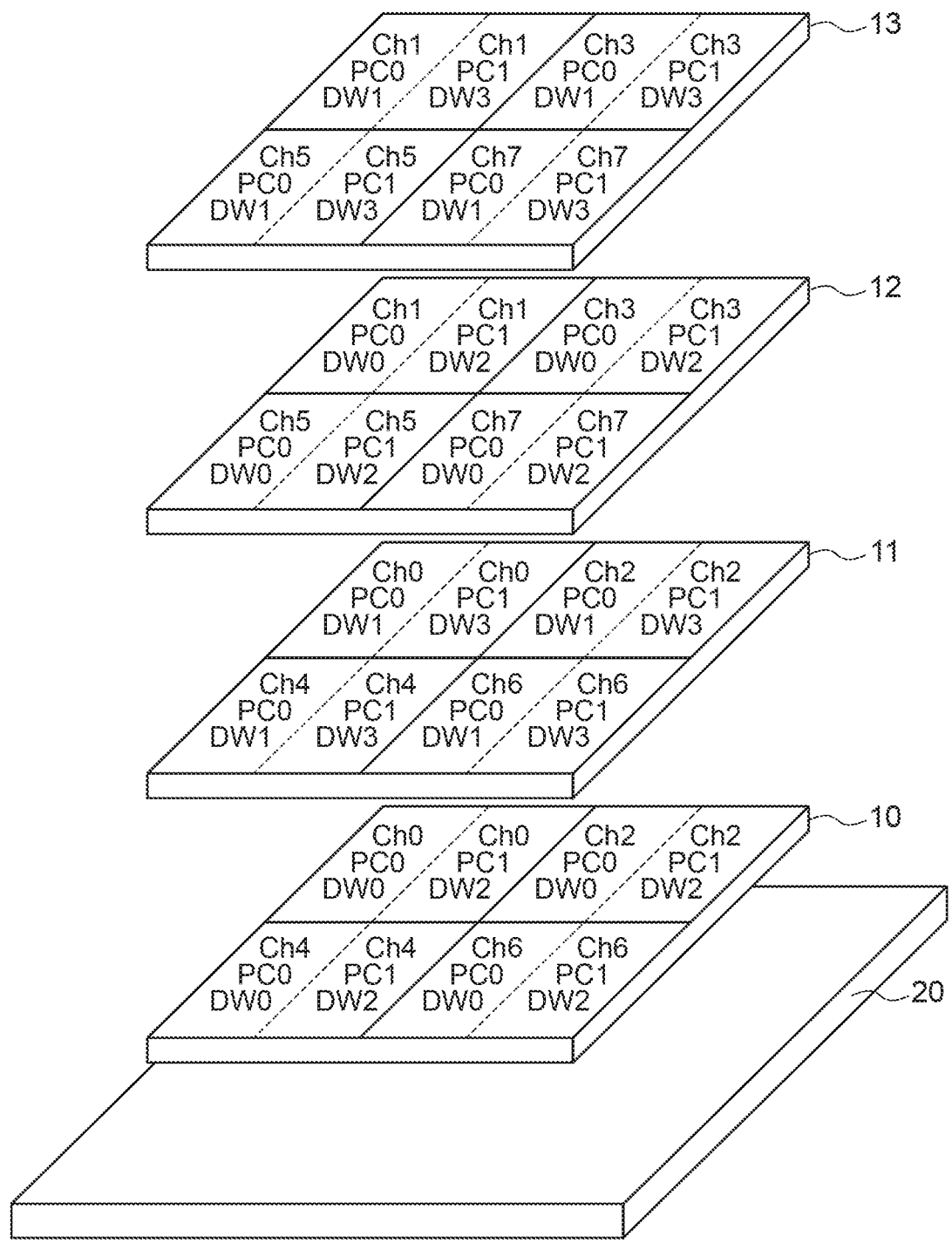
FIG. 1 is a schematic exploded perspective view showing an example of a semiconductor device according to the present disclosure.

A semiconductor device 1 shown in FIG. 1 has a control chip 20, and four memory chips 10 to 13 stacked on the control chip 20. The memory chips 10 to 13 are, for example, DRAMs (Dynamic Random Access Memories). Each of the memory chips 10 to 13 is divided into four channels and the channels can operate independently of each other. Therefore, terminals such as a data input/output terminal, an address terminal, a command terminal, and a clock terminal are assigned to each of the channels. The memory chips 10 and 11 are divided into channels Ch0, Ch2, Ch4, and Ch6 and the memory chips 12 and 13 are divided into channels Ch1, Ch3, Ch5, and Ch7. Therefore, the semiconductor device 1 has a configuration including a total of eight channels. The terminals such as the data input/output terminals, the address terminals, the command terminals, and the clock terminals respectively assigned to the channels Ch0 to Ch7 are connected to the control chip 20 through via conductors provided to penetrate through the memory chips 10 to 13.

As shown in FIG. 1, the channel Ch0 included in the memory chips 10 and 11 and the channel Ch1 included in the memory chips 12 and 13 are located at the same position in a planar view, the channel Ch2 included in the memory chips 10 and 11 and the channel Ch3 included in the memory chips 12 and 13 are located at the same position in a planar view, the channel Ch4 included in the memory chips 10 and 11 and the channel Ch5 included in the memory chips 12 and 13 are located at the same position in a planar view, and channel Ch6 included in the memory chips 10 and 11 and the channel Ch7 included in the memory chips 12 and 13 are located at the same position in a planar view. Each of the channels Ch0 to Ch7 is divided into pseudo channels PC0 and PC1. When one of the channels Ch0 to Ch7 is to be accessed, the access is performed by designating either the pseudo channel PC0 or PC1. The two pseudo channels PC0 and PC1 in the same channel cannot be accessed simultaneously. Meanwhile, the different channels Ch0 to Ch7 can be accessed asynchronously and non-exclusively.

In the present embodiment, the number of I/O bits per channel is 144 bits, where 128 bits are actual data and 16 bits are ECC (Error Correction Code) data. A half of the 128-bit actual data, that is, 64 bits are assigned to one of the pseudo channels, i.e., the pseudo channel PC0 and the remaining 64 bits are assigned to the other pseudo channel PC1. Eight-bit ECC data is assigned to each of the pseudo channels PC0 and PC1. The 64-bit data assigned to the pseudo channel PC0 is constituted by a group DW0 (DWord0) including 32 bits and a group DW1 (DWord1) including 32 bits. Similarly, the 64-bit data assigned to the pseudo channel PC1 is constituted by a group DW2 including 32 bits and a group DW3 including 32 bits. Four-bit ECC data is assigned to each of the groups.

Figure 2:
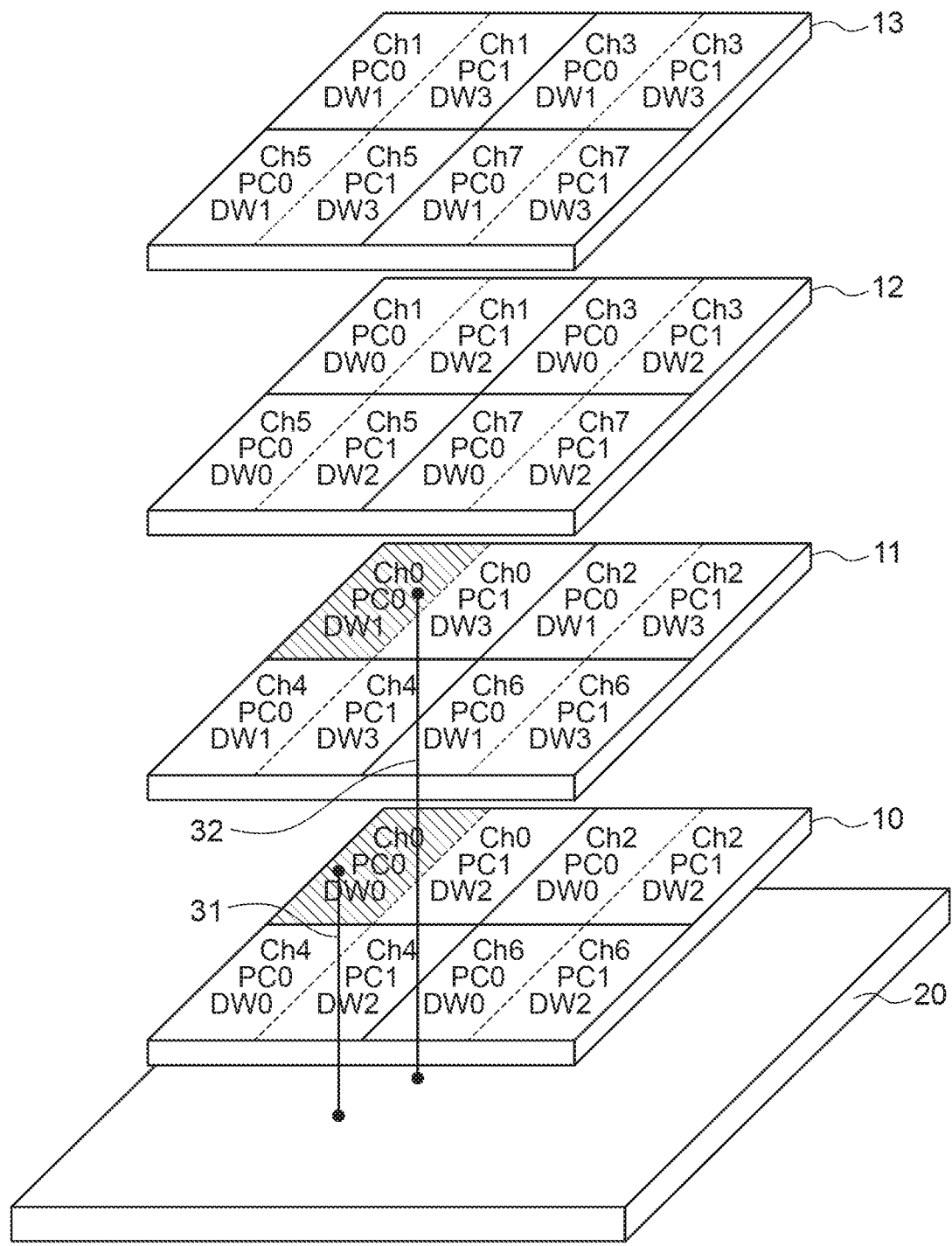
FIG. 2 is a schematic exploded perspective view for explaining an example of access paths included in the semiconductor device according to the present disclosure.

Two groups constituting the same pseudo channel in the same channel are assigned to different memory chips, respectively. For example, in the pseudo channel PC0 of the channel Ch0, the group DW0 is assigned to the memory chip 10 and the group DW1 is assigned to the memory chip 11. Accordingly, for example, when a read request for the pseudo channel PC0 of the channel Ch0 is issued, 32-bit data are output in parallel from the memory chips 10 and 11, respectively. As shown in FIG. 2, via conductors 31 assigned to the group DW0 of the pseudo channel PC0 in the channel Ch0 and via conductors 32 assigned to the group DW1 of the pseudo channel PC0 in the channel Ch0 are provided independently. That is, the control chip 20 and the memory chips 10 to 13 are connected in a one-to-one relation and one via conductor is not assigned to a plurality of memory chips. As a result, even when there are differences in the operation speed among the memory chips 10 to 13 due to process variation, data do not collide in the via conductors. Furthermore, memory cell arrays activated with one access are distributed to two memory chips and therefore change of the power potential due to concentration of current consumption can also be suppressed.

Figure 3A:
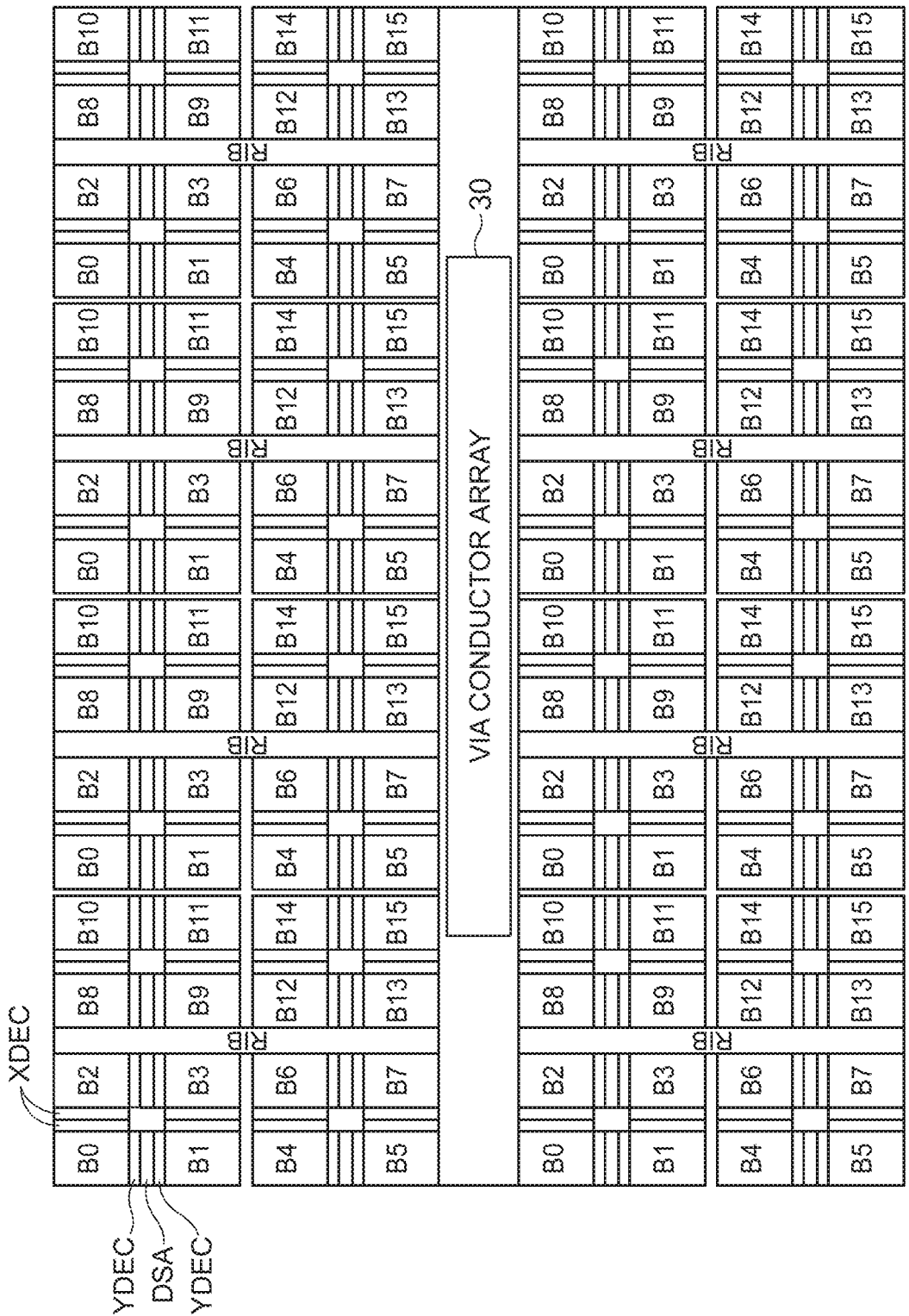
FIGS. 3A and 3B are plan views showing a floor plan of memory chips.
Figure 3B:
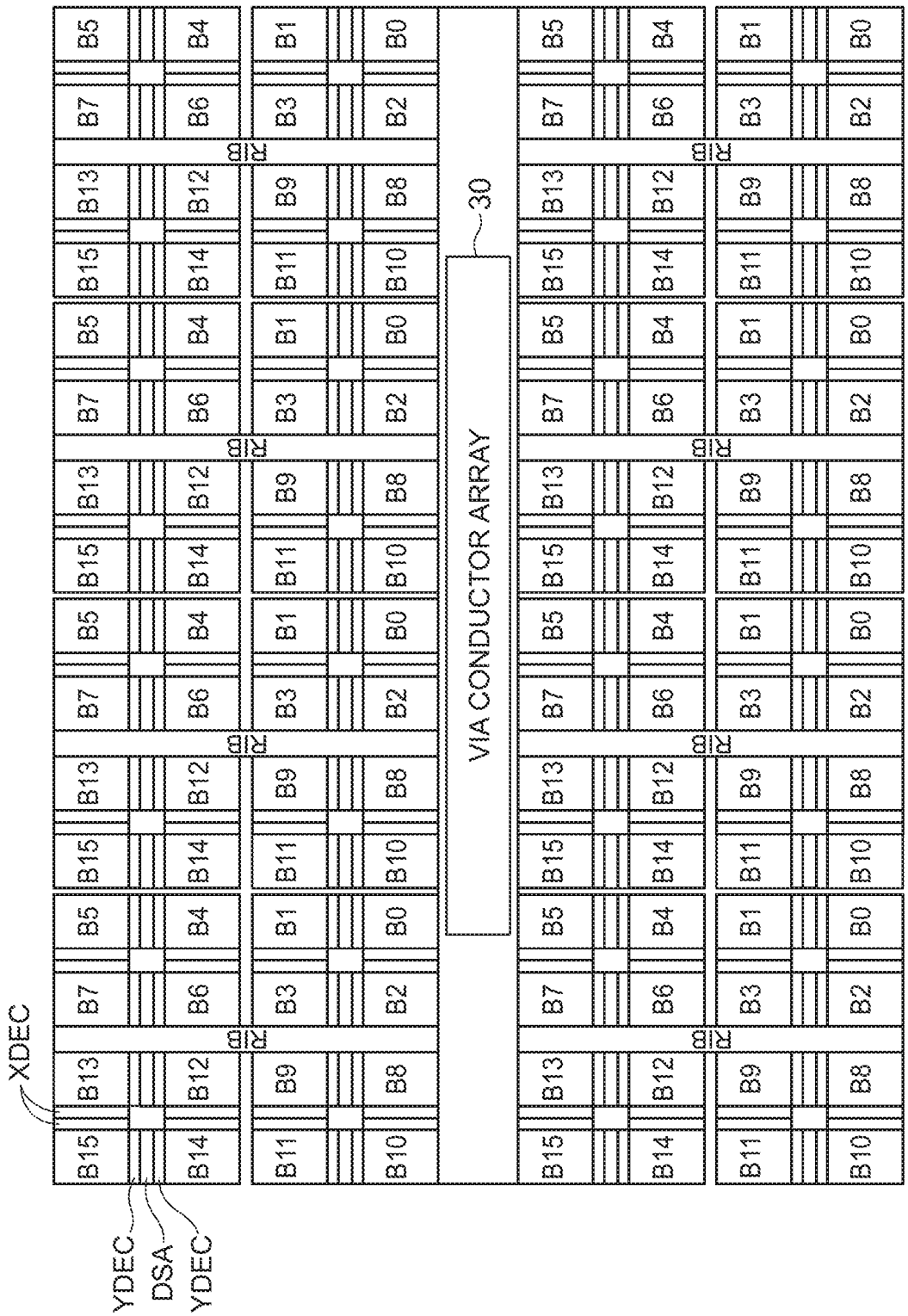

FIG. 3A is a plan view showing a floor plan of the memory chips 10 and 12, and FIG. 3B is a plan view showing a floor plan of the memory chips 11 and 13. As shown in FIGS. 3A and 3B, each of the pseudo channels in each channel is divided into 16 memory banks including memory banks B0 to B15. Positions of the memory banks B0 to B15 on a memory chip differ between the memory chips 10 and 12, and the memory chips 11 and 13. The positions of the memory banks B0 to B15 on the memory chips 10 and 12 are different from the positions of the memory banks B0 to B15 on the memory chips 11 and 13 by 180 degrees. Therefore, planar positions of the memory banks B0 to B15 constituting the same pseudo cannel in the same channel differ between two memory chips. For example, the planar position of the memory bank B0 included in the pseudo channel PC0 of the channel Ch0 differs between the memory chip 10 and the memory chip 11.

Figure 4:
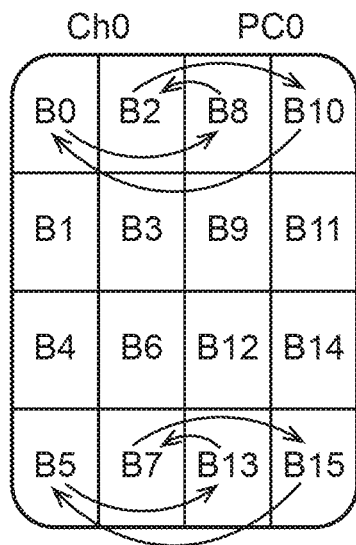
FIG. 4 is a schematic diagram showing a manner of seamless read accesses using eight memory banks.
Figure 4:
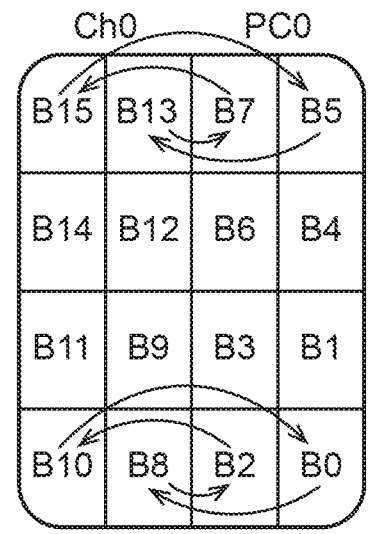
Figure 4:
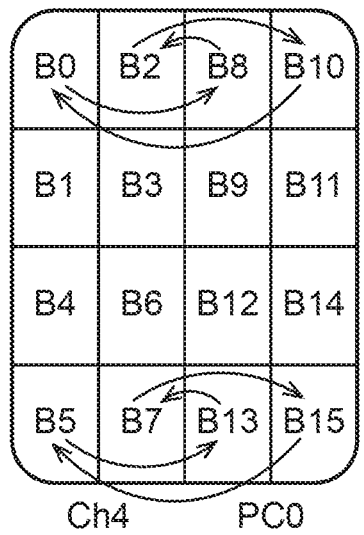
Figure 4:
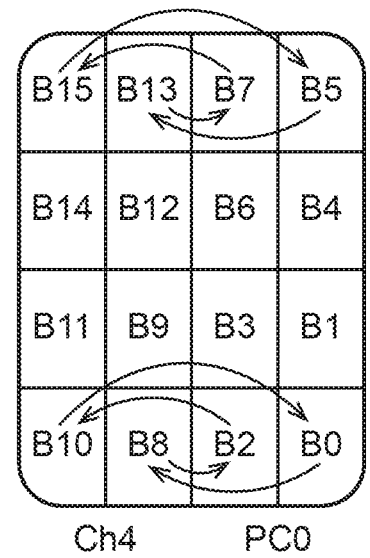

FIG. 4 is a diagram showing an example in which an access to the pseudo channel PC0 in the channel Ch0 and an access to the pseudo channel PC0 in the channel Ch4 are performed in parallel. In the example shown in FIG. 4, a seamless read access using eight memory banks is performed in each of the channels Ch0 and Ch4. In the present embodiment, even in a case where such a seamless read access is performed, the positions of accessed memory banks are distributed and therefore change of the power potential due to concentration of the current consumption can be suppressed.

Figure 5:
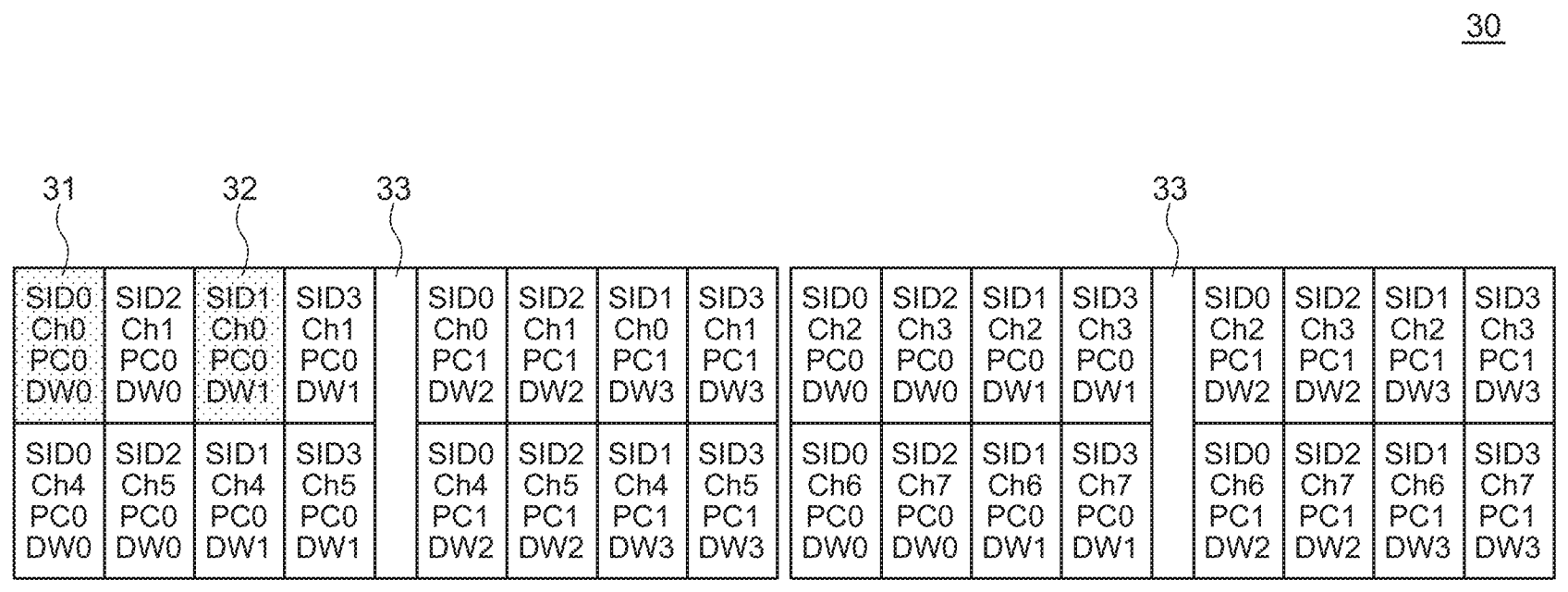

A plurality of via conductors penetrating through the memory chips are arranged in a via formation region 30 shown in FIGS. 3A and 3B. A layout of the via conductors arranged in the via formation region 30 is as shown in FIG. 5. Signs SID0 to SID3 shown in FIG. 5 are slice IDs corresponding to the memory chips 10 to 13, respectively. For example, via conductors corresponding to the group DW0 of the pseudo channel PC0 in the channel Ch0 of the memory chip 10 are arranged in an area 31. Similarly, via conductors corresponding to the group DW1 of the pseudo channel PC0 in the channel Ch0 of the memory chip 11 are arranged in an area 32. The via conductors included in the areas 31 and 32 shown in FIG. 5 correspond to the via conductors 31 and 32 shown in FIG. 2, respectively.

When a read access is performed to the pseudo channel PC0 in the channel Ch0, 32-bit read data read from the memory chip 10 is supplied to the control chip 20 through the via conductors arranged in the area 31, and 32-bit read data read from the memory chip 11 is supplied to the control chip 20 through the via conductors arranged in the area 32. The 32-bit read data read from the memory chip 10 and the 32-bit read data read from the memory chip 11 are transferred substantially simultaneously. When a write access is performed to the pseudo channel PC0 in the channel Ch0, 32-bit write data to be written in the memory chip 10 is supplied from the control chip 20 to the memory chip 10 through the via conductors arranged in the area 31, and 32-bit write data to be written in the memory chip 11 is supplied from the control chip 20 to the memory chip 11 through the via conductors arranged in the area 32. The 32-bit write data to be written in the memory chip 10 and the 32-bit write data to be written in the memory chip 11 are transferred substantially simultaneously. A plurality of via conductors for supplying address signals to the memory chips 10 to 13 are arranged in an area 33.

FIG. 6 is a table showing a layout of the via conductors arranged in the area 31. As shown in FIG. 6, the via conductors arranged in the area 31 include 32 via conductors corresponding to data DQ0R to DQ31R, respectively and 32 via conductors corresponding to data DQ0F to DQ31F, respectively. The data DQ0R to DQ31R are data of 32 bits simultaneously input/output in synchronization with a rising edge of a clock signal, and the data DQ0F to DQ31F are data of 32 bits simultaneously input/output in synchronization with a falling edge of a clock signal. Other via conductors such as via conductors corresponding to data mask signals DM0R to DM3R and DM0F to DM3F and via conductors corresponding to a read clock signal and a write clock signal are also included in the area 31. In the example shown in FIG. 6, paired data, for example, the data DQ0R and the data DQ0F are arranged adjacent to each other.

Figure 7:
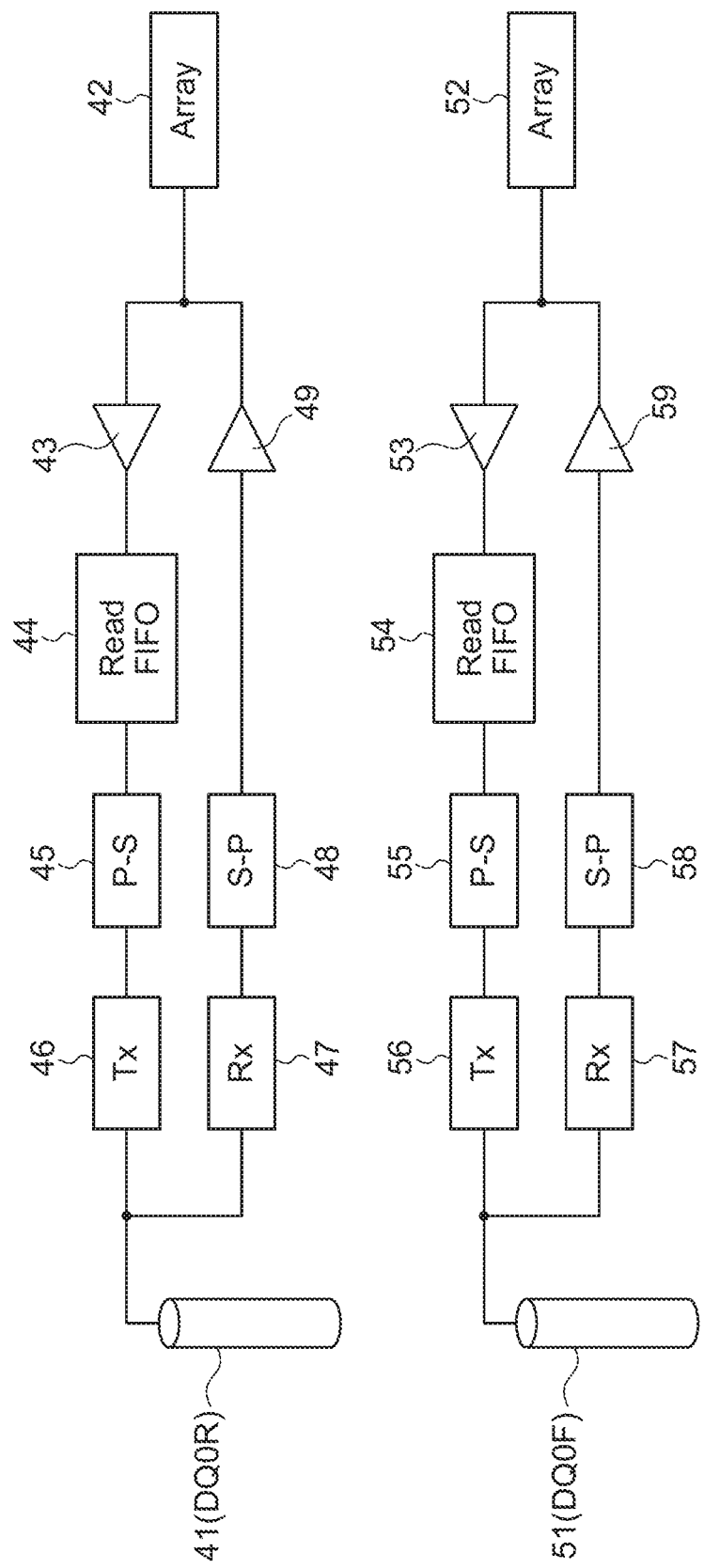
FIG. 7 is a circuit diagram showing an example of a connection relation between via conductors and memory cell arrays.

FIG. 7 is a circuit diagram showing an example of a connection relation between via conductors and memory cell arrays. In the example shown in FIG. 7, a read path including an internal buffer 43, a read FIFO circuit 11, a parallel-serial conversion circuit 45 and an output buffer 46, and a write path including an input receiver 47, a serial-parallel conversion circuit 48, and an internal buffer 49 are connected in parallel between a via conductor 41 and a memory cell array 42 corresponding to the data DQ0R. Similarly, a read path including an internal buffer 53, a read FIFO circuit 54, a parallel-serial conversion circuit 55, and an output buffer 56, and a write path including an input receiver 57, a serial-parallel conversion circuit 58, and an internal buffer 59 are connected in parallel between a via conductor 51 and a memory cell array 52 corresponding to the data DQ0F. In this way, the read path and the write path are assigned individually to each of the via conductors in the example shown in FIG. 7.

Figure 8:
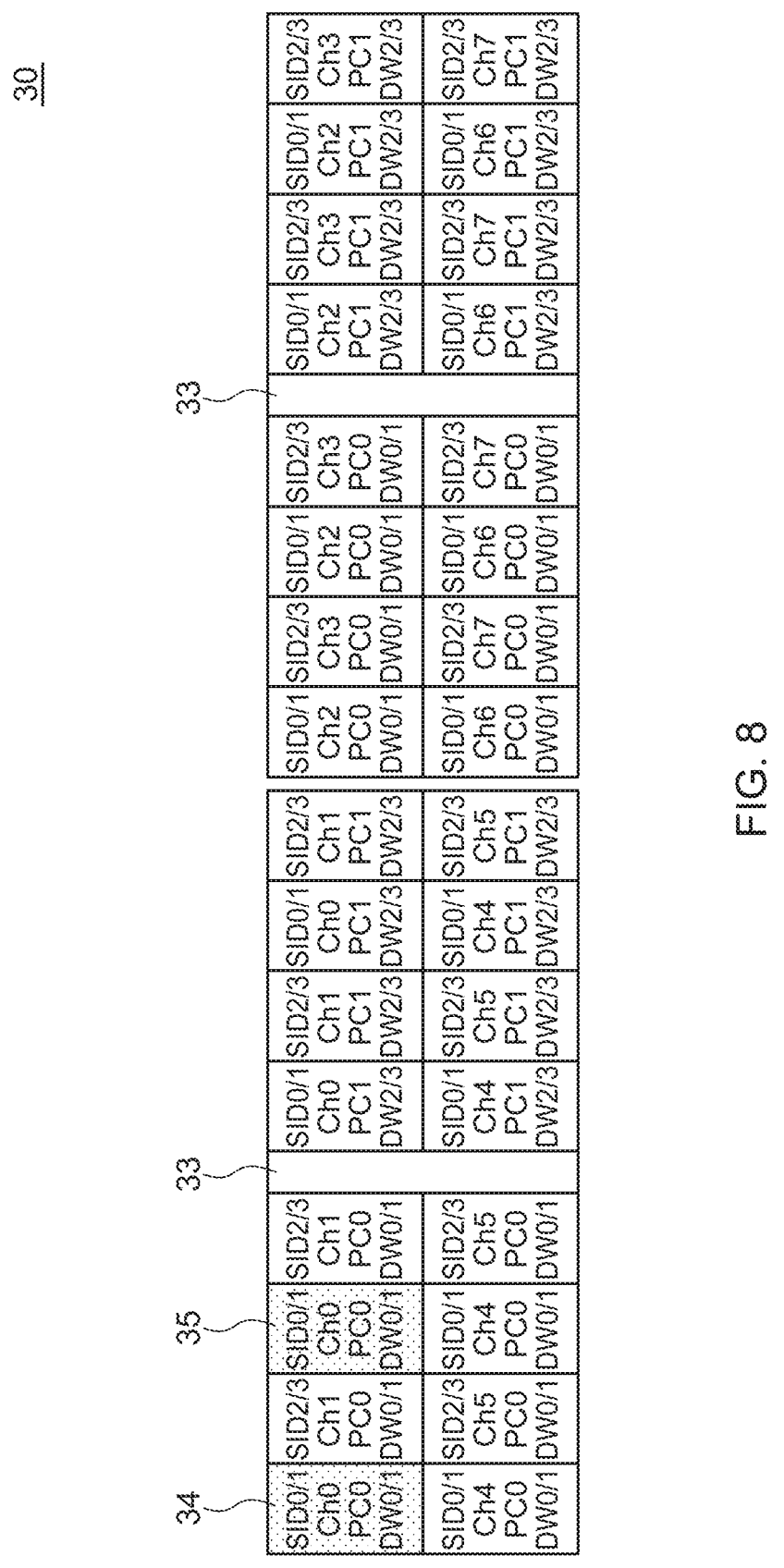

FIG. 8 shows another layout of the via conductors arranged in the via formation region 30. In the example shown in FIG. 8, a plurality of via conductors corresponding to the same pseudo channel in the same channel are not arranged collectively for each of the memory chips, that is, for each of the groups DW and a plurality of via conductors corresponding to the two groups DW are mixed in one area. For example, via conductors corresponding to the group DW0 and the group DW1 of the pseudo channel PC0 in the channel Ch0 are arranged in a mixed manner in areas 34 and 35.

Figure 9A:

FIGS. 9A and 9B show layouts of via conductors arranged in the areas 34 and 35, respectively. As shown in FIGS. 9A and 9B, while the layouts of the via conductors arranged in the areas 34 and 35 are the same as the layout of the via conductors arranged in the area 31 shown in FIG. 6, via conductors adjacent in the row direction are assigned to different memory chips. That is, via conductors arranged in columns A, C, E, and G are assigned to the memory chip 10 (SID0/DW0) and via conductors arranged in columns B, D, F, and H are assigned to the memory chip 11 (SID1/DW1)

in the area 34. Meanwhile, via conductors arranged in the columns A, C, E, and G are assigned to the memory chip 11 (SID1/DW1) and via conductors arranged in the columns B, D, F, and H are assigned to the memory chip 10 (SID0/DW0) in the area 35.

Figure 10:
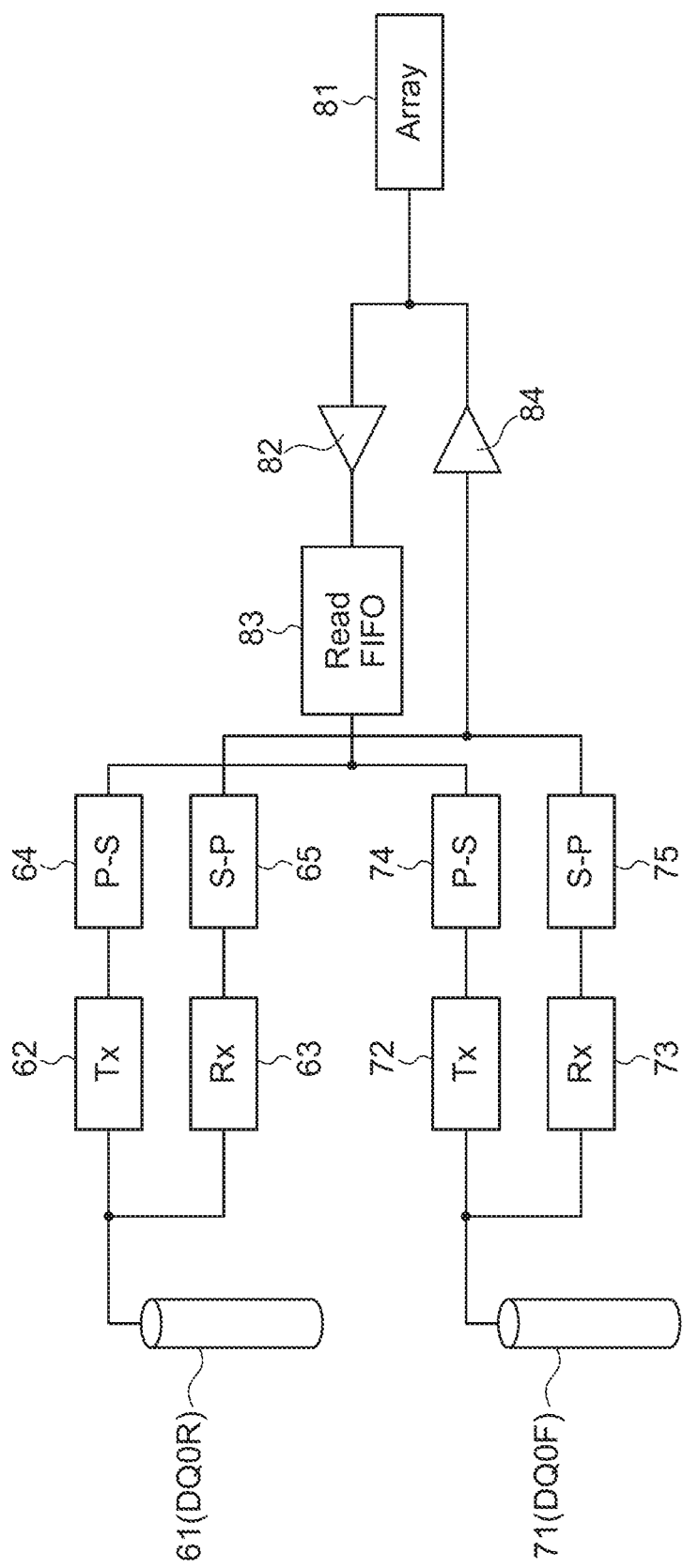
FIG. 10 is a circuit diagram showing another example of a connection relation between via conductors and a memory cell array.

FIG. 10 is a circuit diagram showing another example of a connection relation between via conductors and a memory cell array and shows an example suitable for a case where the layout of via conductors is the layout shown in FIGS. 8, 9A, and 9B. In the example shown in FIG. 10, an output buffer 62, an input receiver 63, a parallel-serial conversion circuit 64, and a serial-parallel conversion circuit 65 are assigned to a via conductor 61 corresponding to the data DQ0R, and an output buffer 72, an input receiver 73, a parallel-serial conversion circuit 74, and a serial-parallel conversion circuit 75 are assigned to a via conductor 71 corresponding to the data DQ0F. A memory cell array 81 is assigned in common to the parallel-serial conversion circuits 64 and 74 via an internal buffer 82 and a read FIFO circuit 83, and is assigned in common to the serial-parallel conversion circuits 65 and 75 via an internal buffer 84. However, one of the paths is deactivated and is not operatively connected to the memory cell array 81. For example, when the output buffer 62, the input receiver 63, the parallel-serial conversion circuit 64, and the serial-parallel conversion circuit 65 corresponding to the via conductor 61 are activated, the output buffer 72, the input receiver 73, the parallel-serial conversion circuit 74, and the serial-parallel conversion circuit 75 corresponding to the via conductor 71 are deactivated. As a result, the via conductor 71 and the memory cell array 81 are not operatively connected to each other. In this case, the via conductor 61 and the memory cell array 81 are operatively connected to each other.

In this way, when the via conductors are arranged in the layout shown in FIGS. 8, 9A, and 9B, adjacent via conductors are assigned to different memory chips and therefore the internal buffers 82 and 84 and the read FIFO circuit 83 can be assigned in common to two via conductors. This halves the numbers of the internal buffers 82 and 84 and the read FIFO circuits 83 and accordingly the chip area can be reduced.

Figure 11:
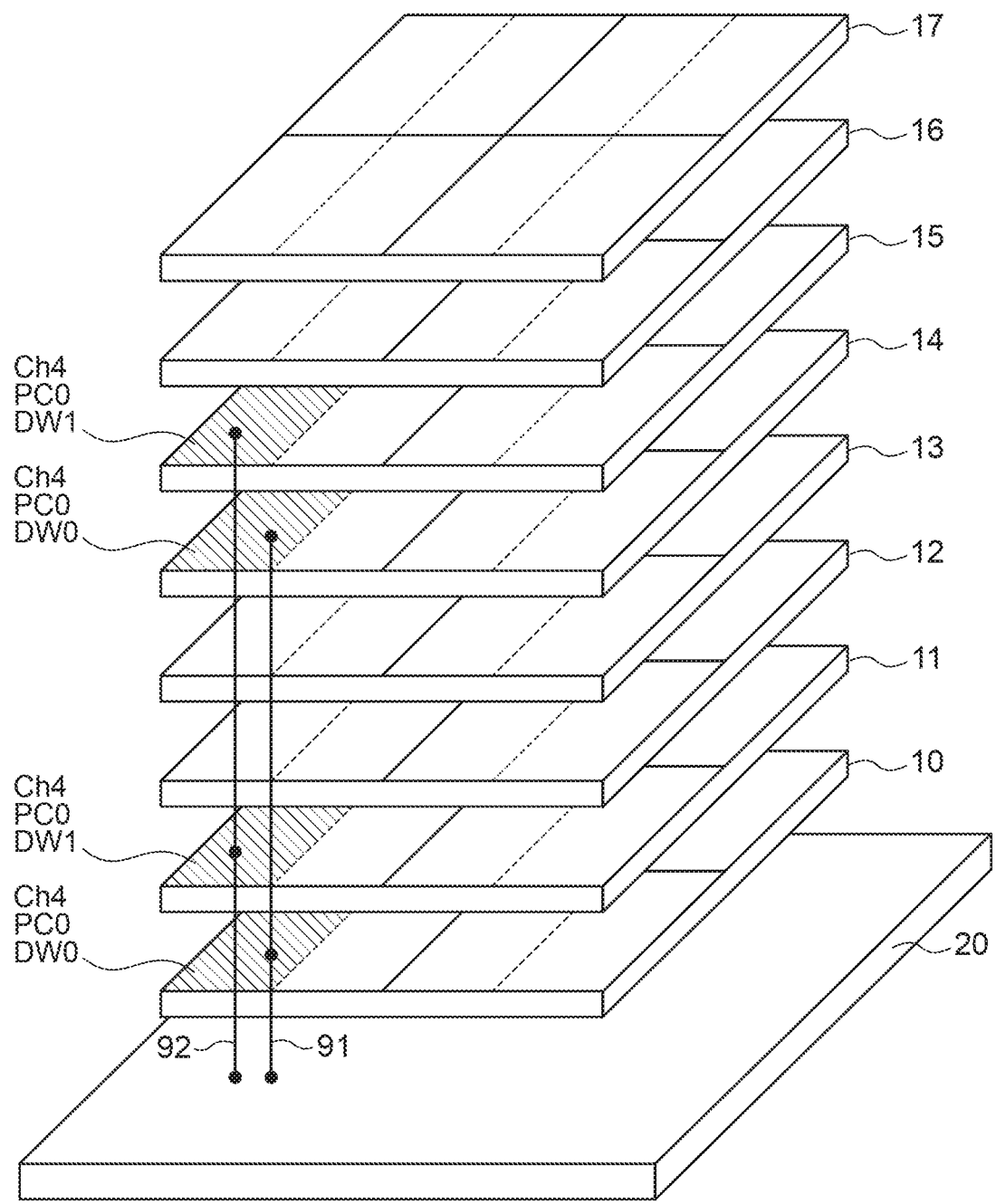
FIG. 11 is a schematic exploded perspective view showing another example of the semiconductor device according to the present disclosure.

A semiconductor device 2 shown in FIG. 11 has the control chip 20, and eight memory chips 10 to 17 stacked on the control chip 20. That is, the semiconductor device 2 has a configuration in which the four memory chips 14 to 17 are added to the semiconductor device 1 shown in FIG. 1. The memory chips 14 to 17 have the same address configurations as those of the memory chips 10 to 13, respectively except for the chip addresses (SIDs). Selection of the memory chips 10 to 13 and the memory chips 14 to 17 can be performed, for example, using a least significant bit of the chip address.

Accordingly, for example, when a read request is issued to the pseud channel PC0 in the channel Ch4 and when the least significant bit of the chip address is 0 (zero), the memory chips 10 and 11 are selected, so that 32-bit read data is output from the memory chip 10 through via a conductor 91 assigned to the group DW0 of the pseudo channel PC0 in the channel Ch4 and 32-bit read data is output from the memory chip 11 through a via conductor 92 assigned to the group DW1 of the pseudo channel PC0 in the channel Ch4. In this case, the pseudo channels PC0 of the channel Ch4 included in the memory chips 14 and 15 are not accessed. On the other hand, when a read request is issued to the pseudo channel PC0 in the channel Ch4 and the least significant bit of the chip address is 1, the memory chips 14 and 15 are selected, so that the 32-bit read data is output from the memory chip 14 through the via conductor 91 and 32-bit read data is output from the memory chip 15 through the via conductor 92. In this case, the pseudo channels PC0 of the channel Ch4 included in the memory chips 10 and 11 are not accessed. As described above, the number of memory chips in the semiconductor device 2 shown in FIG. 11 is doubled as compared to the semiconductor device 1 shown in FIG. 1 and therefore the connection between the control chip 20 and the memory chips 10 to 17 has a one-to-two relation.

The number of the memory chips is not specifically limited. For example, it is also possible that twelve memory chips are stacked on the control chip. In this case, the connection between the control chip and the memory chips has a one-to-three relation. Further, it is also possible that the number of the memory chips is two.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. An apparatus comprising:
a control chip; and
a plurality of memory chips stacked on the control chip, the plurality of memory chips including first and second memory chips;
wherein each of the first and second memory chips is divided into a plurality of channels, each channel of the plurality of channels includes a first pseudo channel and a second pseudo channel, each of the first and second pseudo channels in each channel is divided into a plurality of memory banks, each first pseudo channel includes a first memory bank having a first portion in the first memory chip and having a second portion in the second memory chip; and
wherein a planar position of the first portion of the first memory bank in the first memory chip differs from a planar position of the second portion of the first memory bank in the second memory chip.

2. The apparatus of claim 1, wherein each of the second pseudo channels includes the first memory bank having a third portion in the first memory chip and having a fourth portion in the second memory chip, and
wherein a planar position of the third portion of the first memory bank in the first memory chip differs from a planar position of the fourth portion of the first memory bank in the second memory chip.

3. The apparatus of claim 1, wherein each of the memory banks of the plurality of memory banks having a first portion in the first memory chip and a second portion in the second memory chip,
wherein a planar position of the first portion of each memory bank of the plurality of memory banks in the first memory chip differs from a planar position of the second portion of each memory bank of the plurality of memory banks in the second memory chip.

4. The apparatus of claim 3, wherein the planar positions of the first portions of each memory bank of the plurality of memory banks in the first memory chip are different from the planar positions of the second portions of each memory bank of the plurality of memory banks in the second memory chip by 180 degrees.

5. The apparatus of claim 3, wherein the plurality of memory banks of the first pseudo channel comprises 16 memory banks.

6. The apparatus of claim 1, wherein the first channel in the first memory chip is located at a same planar position as the first channel in the second memory chip.

7. The apparatus of claim 1, further comprising a plurality of via conductors penetrating through the memory chips, the plurality of via conductors are arranged in a via formation region, the formation region including a plurality of areas, each of the areas including a respective plurality of via conductors.

8. The apparatus of claim 7, wherein a first area of the plurality of areas including via conductors corresponding to the first pseudo channel in a first channel of the plurality of channels of the first memory chip, and wherein a second area of the plurality of areas including via conductors corresponding to the first pseudo channel in the first channel of the plurality of channels of the second memory chip.

9. The apparatus of claim 7, wherein the first pseudo channel comprises a first group and a second group, a first area and a second area of the plurality of areas each includes via conductors corresponding to the first pseudo channel of a first channel of the plurality of channels in the first and second memory chips, and wherein the via conductors corresponding to the first group and the second group of the first pseudo channel in the first channel are mixed in the first area and the second area.

10. An apparatus comprising:
a first memory chip; and
a second memory chip stacked on the first memory chip, wherein each of the first and second memory chips is divided into a plurality of channels including a first channel and a second channel, each channel of the plurality of channels includes a first pseudo channel and a second pseudo channel, each pseudo channel has a first group in the first memory chip and a second group in the second memory chip, the first group and the second group of the first pseudo channel each includes a plurality of memory banks, and wherein each of the memory banks of the first group has a planar position different than a planar position of each of the memory banks of the second group.

11. The apparatus of claim 10, wherein the first group provides 32 bits per read request and the second group provides 32 bits per read request.

12. The apparatus of claim 11, wherein four-bit error correction code data is assigned to each of the first group and the second group.

13. The apparatus of claim 12, wherein an eight-bit error correction code data is assigned to each of the first pseudo channel and the second pseudo channel.

14. The apparatus of claim 10, further comprising:
a first via conductor; and
a second via conductor, wherein the first via conductor is assigned to the first group of the first pseudo channel in the first channel and the second via conductor assitmed to the second group of the first pseudo channel in the first channel.

15. The apparatus of claim 14, further comprising:
a control chip, wherein the control chip is coupled to the first memory chip and the second memory chip in a one-to-one relationship, and the first via conductor is assigned to the first memory chip and the second via conductor is assigned to the second memory chip.

16. The apparatus of claim 14, further comprising:
a control chip,
a third memory chip of the plurality of memory chips, and
a fourth memory chip of the plurality of memory chips stacked on third memory chip, wherein the first group is assigned to the third chip and the second group is assigned to the fourth chip, the control chip is coupled to the first and third memory chips through the first via conductor, and the control chip is coupled to the second and fourth memory chips through the second via conductor.

17. The apparatus of claim 10, wherein the first channel in the first memory chip is located at a same planar position as the first channel in the second memory chip.

18. An apparatus comprising:
a control chip; and
a plurality of memory chips stacked on the control chip, the plurality of memory chips including a first memory chip and a second memory chip, wherein each of the first and second memory chips is divided into four channels including first to fourth channels, the first channel in each of the first and second memory chips has a plurality of memory banks including a first memory bank, and wherein the first memory bank in the first memory chip is located at a different planar position from the first memory bank in the second memory chip.

19. The apparatus of claim 18, wherein the plurality of memory chips further comprises a third memory chip and a fourth memory chip, wherein each of the third and fourth memory chips is divided into four channels including the first to fourth channels.

20. The apparatus of claim 19, further comprising a first via conductor connected in common to the first channel in the first and third memory chips, and a second via conductor connected in common to the first channel in the second and fourth memory chips.

* * * * *